(12) United States Patent
Moriuchi

(10) Patent No.: US 12,550,291 B2
(45) Date of Patent: Feb. 10, 2026

(54) TEMPERATURE REGULATION UNIT AND METHOD FOR MANUFACTURING TEMPERATURE REGULATION UNIT

(71) Applicant: Tomegawa Corporation, Tokyo (JP)

(72) Inventor: Hideki Moriuchi, Shizuoka (JP)

(73) Assignee: Tomoegawa Corporation, Tokyo (JP)

( * ) Notice: Subject to any disclaimer, the term of this patent is extended or adjusted under 35 U.S.C. 154(b) by 225 days.

(21) Appl. No.: 18/000,089

(22) PCT Filed: May 26, 2021

(86) PCT No.: PCT/JP2021/020034
§ 371 (c)(1),
(2) Date: Nov. 28, 2022

(87) PCT Pub. No.: WO2021/241642
PCT Pub. Date: Dec. 2, 2021

(65) Prior Publication Data
US 2023/0200006 A1 Jun. 22, 2023

(30) Foreign Application Priority Data
May 29, 2020 (JP) ................................. 2020-094380

(51) Int. Cl.
*H05K 7/20* (2006.01)
*F28F 1/02* (2006.01)

(52) U.S. Cl.
CPC ......... *H05K 7/20263* (2013.01); *F28F 1/025* (2013.01)

(58) Field of Classification Search
CPC ........ H05K 7/20263; F28F 1/025; F28F 1/10; F28F 1/40; F28F 13/12; F28F 13/003;
(Continued)

(56) References Cited

U.S. PATENT DOCUMENTS 4,771,826 A * 9/1988 Grehier .................. F28F 3/083
165/DIG. 392
5,988,266 A * 11/1999 Smith ..................... F28F 3/022
174/16.3

(Continued)

FOREIGN PATENT DOCUMENTS

CN 102884620 A 1/2013
CN 105225984 A 6/2016
(Continued)

OTHER PUBLICATIONS

Supplemental European Search Report for related EP Application No. 21814287 dated Oct. 9, 2023 (1 pp).
(Continued)

*Primary Examiner* — Joel M Attey
(74) *Attorney, Agent, or Firm* — Renner, Kenner, Greive, Bobak, Taylor & Weber

(57) ABSTRACT

A temperature regulation unit (10) includes a plurality of stacked porous metal structures (for example, metal fiber structures (40, 42)) each of which has a plurality of rod-shaped members (32, 34) extending parallel to each other so as to be spaced apart from each other and a connection member (24, 26) connecting the respective rod-shaped members (32, 34) and is formed from metal, the respective rod-shaped members (32, 34) of the respective porous metal structures extend parallel to each other, and a flow passage (50) for a fluid is formed in a gap between the respective rod-shaped members (32, 34).

15 Claims, 11 Drawing Sheets

(58) Field of Classification Search
CPC .............. F28F 2250/02; F28F 2250/04; F28F 2255/18; F28F 3/044; F28F 3/048; F28F 3/022
USPC ........................................................ 165/80.4
See application file for complete search history.

(56) References Cited

U.S. PATENT DOCUMENTS

| | | | | |
|---|---|---|---|---|
| 11,075,143 | B2* | 7/2021 | Tamura | ................. F28F 3/12 |
| 12,117,250 | B2* | 10/2024 | Fujiwara | ................. B22F 5/10 |
| 2009/0001501 | A1 | 1/2009 | Fuyuki et al. | |
| 2009/0145581 | A1 | 6/2009 | Hoffman et al. | |
| 2011/0056652 | A1* | 3/2011 | Neher | ................. F28F 9/0241 |
| | | | | 164/47 |
| 2013/0056187 | A1 | 3/2013 | Kayamoto et al. | |
| 2014/0138063 | A1 | 5/2014 | Kawaura et al. | |
| 2015/0007965 | A1 | 1/2015 | Joshi | |
| 2015/0009631 | A1 | 1/2015 | Joshi | |
| 2015/0204623 | A1* | 7/2015 | Neher | ................. F28D 7/1684 |
| | | | | 164/47 |
| 2015/0377571 | A1 | 12/2015 | Hiroki | |
| 2018/0045472 | A1* | 2/2018 | MacLellan | ............ F28D 9/0031 |
| 2020/0156309 | A1* | 5/2020 | Nellis | ................. B33Y 80/00 |

FOREIGN PATENT DOCUMENTS

| | | |
|---|---|---|
| JP | 2017-135227 A | 8/2017 |
| JP | 2019-009433 A | 1/2019 |
| JP | 2019-201026 A | 11/2019 |
| JP | 2005-123496 A | 2/2022 |

OTHER PUBLICATIONS

International Search Report dated Jul. 19, 2021 for PCT/JP2021/020034.
Taiwan Office Action issued Feb. 22, 2022 in Patent Application No. 110119499.

* cited by examiner

TEMPERATURE REGULATION UNIT AND METHOD FOR MANUFACTURING TEMPERATURE REGULATION UNIT

TECHNICAL FIELD

The present invention relates to a temperature regulation unit and a method for manufacturing the temperature regulation unit.

BACKGROUND ART

Hitherto, temperature regulation units have been used in electric equipment, electronic equipment, semiconductor equipment, etc., to protect circuits and other components that are sensitive to heat generation. More specifically, as the amount of power used by electric equipment or the like increases, the amount of heat generated also increases, and thus the internal temperature of the electric equipment or the like is regulated by cooling the generated heat with a temperature regulation unit.

As such a temperature regulation unit, for example, temperature regulation units disclosed in Japanese Laid-Open Patent Publication No. 2019-9433 (JP2019-9433A), etc., are known. The temperature regulation units disclosed in Japanese Laid-Open Patent Publication No. 2019-9433, etc., each include a metal fiber sheet made of metal fibers, and a cooling mechanism for cooling the metal fiber sheet, has an excellent cooling effect, is easily made smaller and thinner, and enables local cooling of the inside of electric equipment or the like.

SUMMARY OF THE INVENTION

Although the temperature regulation unit disclosed in Japanese Laid-Open Patent Publication No. 2019-9433 is easily made smaller and thinner, the temperature regulation unit has a small heat exchange area for transferring heat to a fluid flowing through a flow passage, so that the heat exchange capability of the temperature regulation unit may be insufficient when additional heat exchange capability is required, such as when cooling semiconductor components that use large amounts of current.

The present invention has been made in consideration of such circumstances, and an object of the present invention is to provide a temperature regulation unit having excellent heat exchange capability, and a method for manufacturing the temperature regulation unit.

A temperature regulation unit of the present invention includes a plurality of stacked porous metal structures each of which has a plurality of rod-shaped members extending parallel to each other so as to be spaced apart from each other and a connection member connecting the respective rod-shaped members and is formed from metal, the respective rod-shaped members of the respective porous metal structures extend parallel to each other, and a flow passage for a fluid is formed in a gap between the respective rod-shaped members.

A method for manufacturing a temperature regulation unit of the present invention includes the steps of: accumulating a plurality of metal fibers, metal particles, or mixtures of metal fibers and metal particles on a receiving part; sintering the plurality of metal fibers, metal particles, or mixtures accumulated on the receiving part, to produce a plurality of porous metal structures each of which has a plurality of rod-shaped members extending parallel to each other so as to be spaced apart from each other and a connection member connecting the respective rod-shaped members and is formed from metal; and stacking the plurality of porous metal structures such that the respective rod-shaped members of the respective porous metal structures extend parallel to each other, to form a flow passage for a fluid in a gap between the respective rod-shaped members.

According to the temperature regulation unit and the method for manufacturing a temperature regulation unit of the present invention, it is possible to obtain a temperature regulation unit having excellent heat exchange capability.

DESCRIPTION OF THE PREFERRED EMBODIMENTS

Hereinafter, an embodiment of the present invention will be described with reference to the drawings. FIG. 1 to FIG. 7 are diagrams showing a temperature regulation unit according to the present embodiment. The temperature regulation unit according to the present embodiment heats a fluid as a heat-transfer medium and dissipates heat from this fluid. Examples of the fluid as the heat-transfer medium include water, air, antifreezes, organic solvents, and fluorine-based solvents (for example, Fluorinert, Freon).

Figure 1:
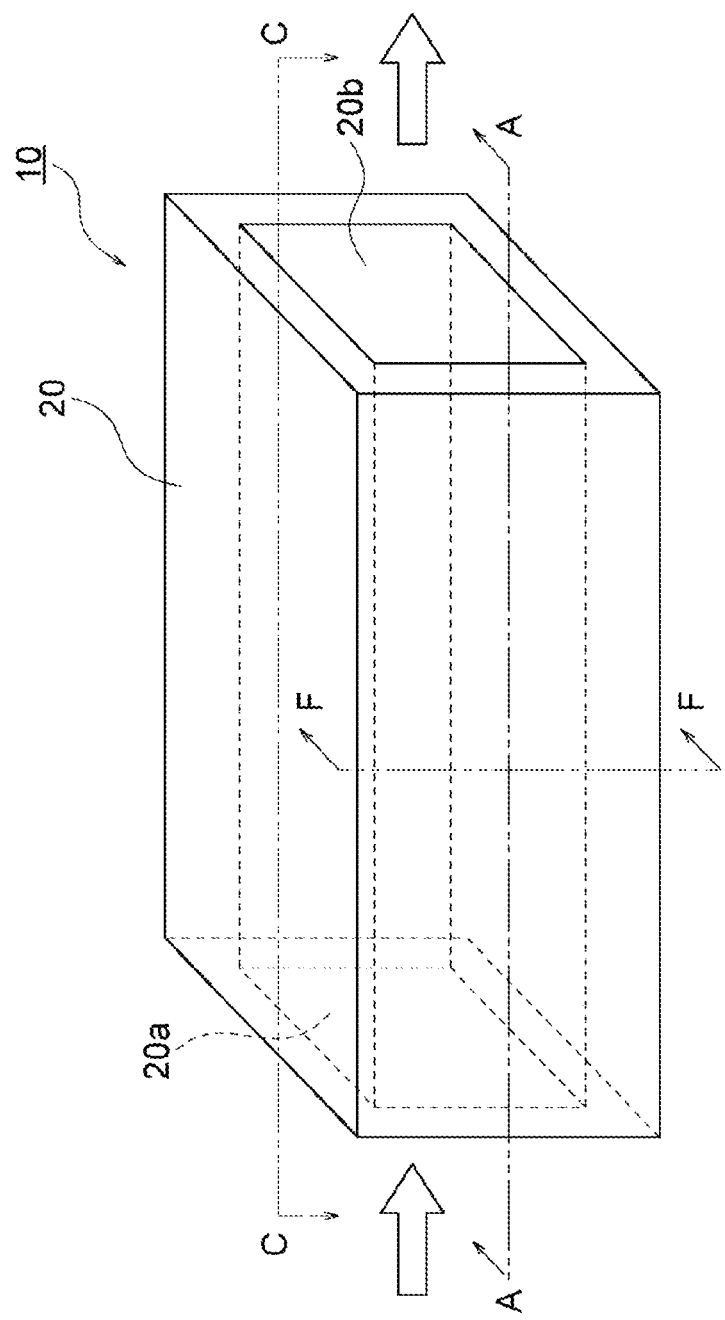
FIG. 1 is a perspective view showing an example of the configuration of a temperature regulation unit according to an embodiment of the present invention.
Figure 2:
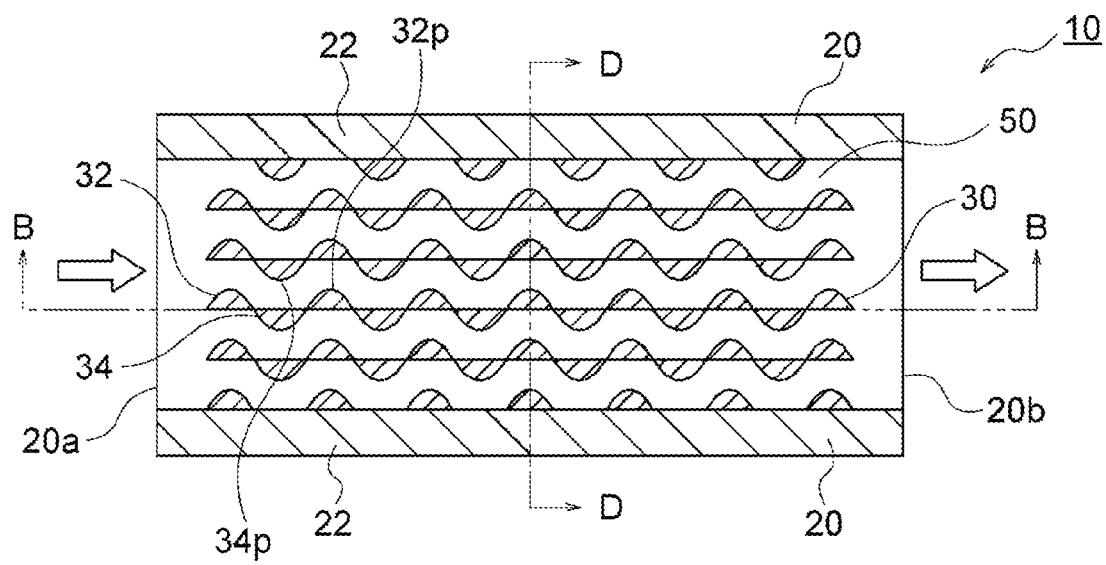
FIG. 2 is a cross-sectional view of the temperature regulation unit shown in FIG. 1, taken along a line A-A.
Figure 3:
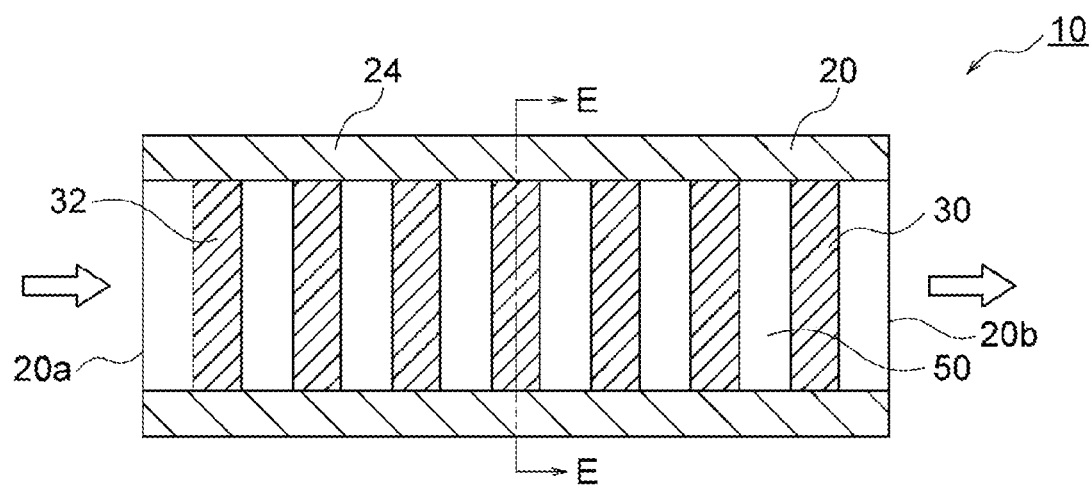
FIG. 3 is a cross-sectional view of the temperature regulation unit shown in FIG. 2, taken along a line B-B, that is, a cross-sectional view of the temperature regulation unit shown in FIG. 1, taken along a line C-C.
Figure 4:
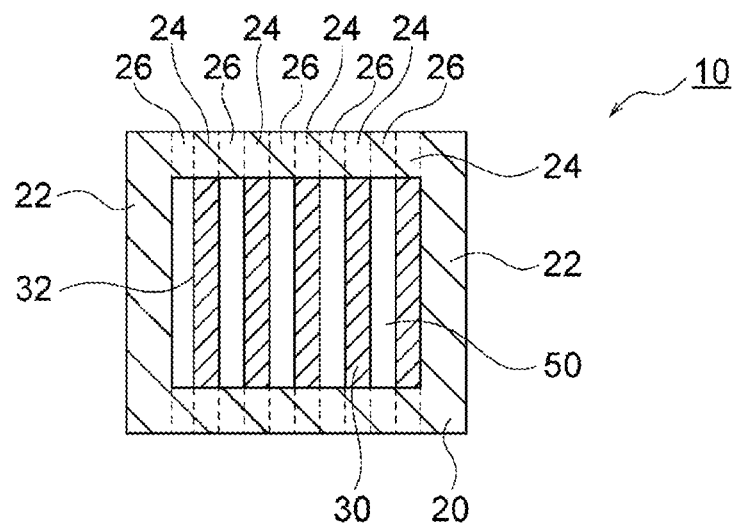
FIG. 4 is a cross-sectional view of the temperature regulation unit shown in FIG. 2, taken along a line D-D, that is, a cross-sectional view of the temperature regulation unit shown in FIG. 3, taken along a line E-E and a cross-sectional view of the temperature regulation unit shown in FIG. 1, taken along a line F-F.

FIG. 1 to FIG. 4 are diagrams showing a temperature regulation unit 10 according to the present embodiment. Specifically, FIG. 1 is a perspective view showing an example of the configuration of the temperature regulation unit 10 according to the present embodiment, and FIG. 2 is a cross-sectional view of the temperature regulation unit 10 shown in FIG. 1, taken along a line A-A. Also, FIG. 3 is a cross-sectional view of the temperature regulation unit 10 shown in FIG. 2, taken along a line B-B, that is, a cross-sectional view of the temperature regulation unit 10 shown in FIG. 1, taken along a line C-C. Also, FIG. 4 is a cross-sectional view of the temperature regulation unit 10 shown in FIG. 2, taken along a line D-D, that is a cross-sectional view of the temperature regulation unit 10 shown in FIG. 3, taken along a line E-E and a cross-sectional view of the temperature regulation unit 10 shown in FIG. 1, taken along a line F-F.

As shown in FIG. 1 to FIG. 4, the temperature regulation unit 10 includes a substantially rectangular parallelepiped-shaped frame 20 having an inlet 20a and an outlet 20b, and a plurality of rod-shaped members 30 provided inside the frame 20, and a flow passage 50 for the fluid is formed in a gap between the respective rod-shaped members 30. This flow passage 50 is a main flow passage for the fluid. In addition, in the present embodiment, a plurality of flow passages 50 extending substantially parallel to each other are formed. The fluid enters the inside of the frame 20 from the inlet 20a of the frame 20, flows through each flow passage 50 in the rightward direction in FIG. 1 and FIG. 2, and flows out of the frame 20 from the outlet 20b. At this time, in each flow passage 50, the fluid flows along a flow direction which is a direction orthogonal to the direction in which the respective rod-shaped members 30 extend (specifically, the rightward direction in FIG. 1 and FIG. 2). The flow direction of the fluid in each flow passage 50 may be slightly tilted from the direction orthogonal to the direction in which the respective rod-shaped members 30 extend. Specifically, an angle between the flow direction of the fluid in each flow passage 50 and the direction orthogonal to the direction in which the respective rod-shaped members 30 extend may be in the range of −10° to 10°. Such a temperature regulation unit 10 will be described in detail below.

Figure 5:
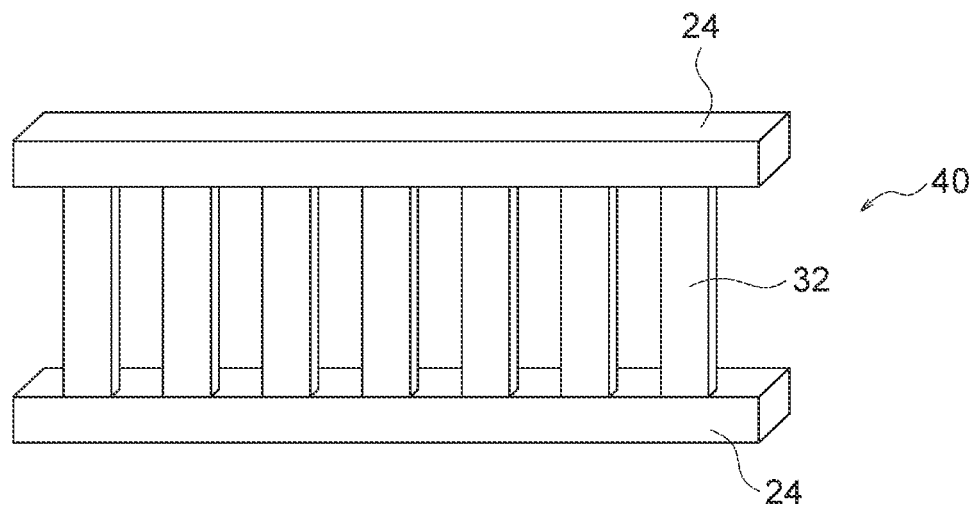
FIG. 5 is a perspective view showing the configuration of a first metal fiber structure included in the temperature regulation unit shown in FIG. 1.
Figure 6:
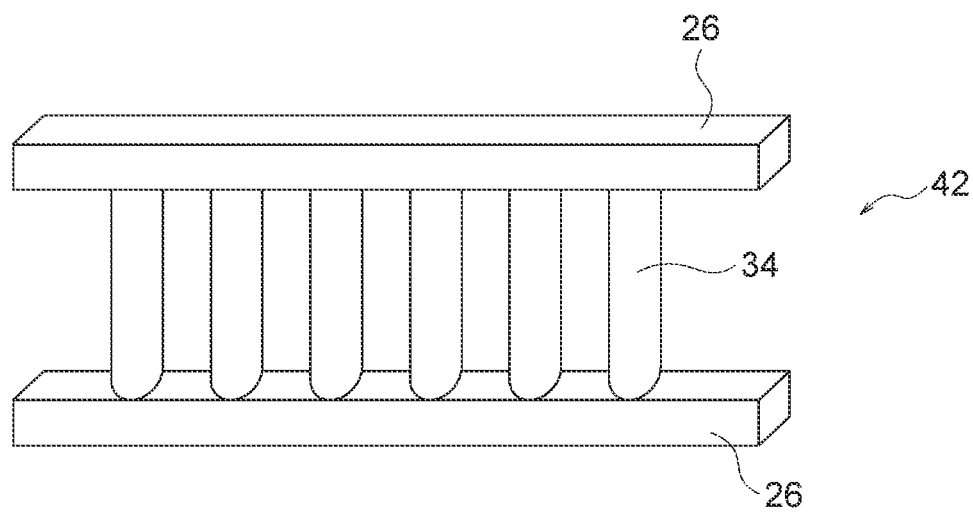
FIG. 6 is a perspective view showing the configuration of a second metal fiber structure included in the temperature regulation unit shown in FIG. 1.
Figure 7:
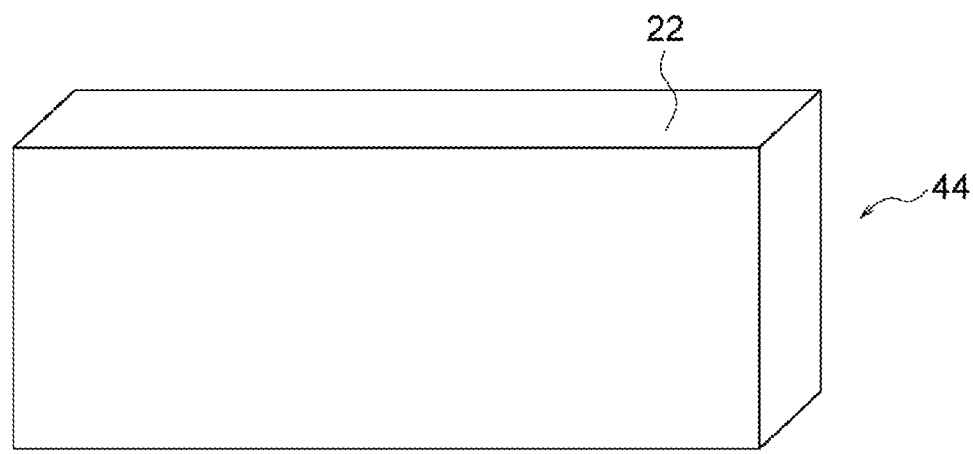
FIG. 7 is a perspective view showing a plate-shaped outer member included in the temperature regulation unit shown in FIG. 1.

The temperature regulation unit 10 shown in FIG. 1 includes a first metal fiber structure 40 shown in FIG. 5 and a second metal fiber structure 42 shown in FIG. 6 which are alternately stacked. Specifically, a metal fiber structure stacked body is formed by alternately stacking the first metal fiber structure 40 shown in FIG. 5 and the second metal fiber structure 42 shown in FIG. 6, and a plate-shaped outer member 44 shown in FIG. 7 is attached to each of both sides of the stacked body. The outer member 44 is composed of a metal body 22. In the case where a liquid is used as the heat-transfer medium, each outer member 44 may be disposed in a watertight manner except for the inlet and outlet surfaces for the heat-transfer medium.

The first metal fiber structure 40 has a plurality of rod-shaped members 32 extending parallel to each other so as to be spaced apart from each other, and a pair of connection members 24 connecting the respective rod-shaped members 32. As shown in FIG. 2, etc., each rod-shaped member 32 has a curved surface. In addition, a cross-sectional shape of each rod-shaped member 32 is a mountain shape. Specifically, the cross-sectional shape of each rod-shaped member 32 is a region surrounded by a straight line and a convex curve (for example, a part of an arc). In addition, the pair of connection members 24 are attached to both ends of each rod-shaped member 32. Accordingly, the first metal fiber structure 40 has a so-called ladder shape.

A method for manufacturing the first metal fiber structure 40 will be described. First, a plurality of metal fibers are deformed by physically impacting the metal fibers, and the plurality of deformed metal fibers are placed on a graphite plate. Specifically, first, a first molding frame having a through hole formed therein with a ladder shape corresponding to the pair of connection members 24 and each rod-shaped member 32 is placed on the graphite plate. Then, the plurality of deformed metal fibers are put into the through hole of the first molding frame. Then, the plurality of metal fibers put into the through hole of the first molding frame are sintered, and are pressed after sintering. Then, when the first molding frame is removed from the graphite plate, the first metal fiber structure 40 is formed on the graphite plate.

The second metal fiber structure 42 has a plurality of rod-shaped members 34 extending parallel to each other so as to be spaced apart from each other, and a pair of connection members 26 connecting the respective rod-shaped members 34. As shown in FIG. 2, etc., each rod-shaped member 34 has a curved surface. In addition, a cross-sectional shape of each rod-shaped member 34 is a mountain shape. Specifically, the cross-sectional shape of each rod-shaped member 34 is a region surrounded by a straight line and a convex curve (for example, a part of an arc). In addition, the pair of connection members 26 are attached to both ends of each rod-shaped member 34. Accordingly, the second metal fiber structure 42 has a so-called ladder shape.

A method for manufacturing the second metal fiber structure 42 will be described. First, a plurality of metal fibers are deformed by physically impacting the metal fibers, and the plurality of deformed metal fibers are placed on a graphite plate. Specifically, first, a second molding frame having a through hole formed therein with a ladder shape corresponding to the pair of connection members 26 and each rod-shaped member 34 is placed on the graphite plate. Then, the plurality of deformed metal fibers are put into the through hole of the second molding frame. Then, the plurality of metal fibers put into the through hole of the second molding frame are sintered, and are pressed after sintering. Then, when the second molding frame is removed from the graphite plate, the second metal fiber structure 42 is formed on the graphite plate.

In the present embodiment, the frame 20 is configured by combining the pair of connection members 24 of the first metal fiber structure 40, the pair of connection members 26 of the second metal fiber structure 42, and a pair of the plate-shaped outer members 44. In addition, the plurality of rod-shaped members 30 provided inside the frame 20 include each rod-shaped member 32 of the first metal fiber structure 40 and each rod-shaped member 34 of the second metal fiber structure 42.

In FIG. 1 to FIG. 3, each connection member 24 of the first metal fiber structure 40 and each connection member 26 of the second metal fiber structure 42 extend in the right-left direction. That is, in the temperature regulation unit 10, the direction in which each connection member 24 of the first metal fiber structure 40 and each connection member 26 of the second metal fiber structure 42 extend is parallel to the flow direction which is the direction in which the fluid flows in each flow passage 50. The flow direction of the fluid in each flow passage 50 may be slightly tilted from a direction orthogonal to the direction in which the respective connection members 24 and 26 extend. Specifically, an angle between the flow direction of the fluid in each flow passage 50 and the direction in which the respective connection members 24 and 26 extend may be in the range of −10° to 10°.

As described above, each of the cross-sectional shapes of the rod-shaped members 32 of the first metal fiber structure 40 and the rod-shaped members 34 of the second metal fiber structure 42 is a mountain shape, that is, a region surrounded by a straight line and a convex curve. Therefore, a tapered portion 32p or 34p is formed around the top of the convex curve of the cross-sectional shape. As shown in FIG. 2, the respective tapered portions 32p and 34p are disposed at both side edges of each flow passage 50.

Moreover, the first metal fiber structure 40 and the second metal fiber structure 42 are alternately stacked such that the tapered portions 32p and 34p of the respective rod-shaped members 32 and 34 of metal fiber structures adjacent to each other face each other or face opposite sides. Accordingly, as shown in FIG. 2, each flow passage 50 meanders along the direction in which the respective connection members 24 and 26 extend, that is, the flow direction (the right-left direction in FIG. 1 and FIG. 2).

Moreover, as shown in FIG. 2, among the pluralities of rod-shaped members 32 and 34 that define the respective side edges of each flow passage 50, two rod-shaped members adjacent to each other are in contact with each other. That is, each rod-shaped member 32 of the first metal fiber structure 40 and each rod-shaped member 34 of the second metal fiber structure 42 adjacent to the first metal fiber structure 40 are in contact with each other. Accordingly, each of the plurality of flow passages 50 extending parallel to each other along the right-left direction in FIG. 2 is demarcated by the rod-shaped members 32 and 34. Therefore, each of the plurality of flow passages 50 does not communicate with another flow passage 50. In this case, the fluid flowing through a certain flow passage 50 and the fluid flowing through another flow passage 50 adjacent to this flow passage 50 can be prevented from interfering with each other and causing a significant disruption of the flow.

Moreover, each of the first metal fiber structure 40 and the second metal fiber structure 42 is formed from metal fibers. Metal-coated fibers may be used as such metal fibers. In addition, each of the first metal fiber structure 40 and the second metal fiber structure 42 may be a metal fiber structure into which a nonwoven fabric, a woven fabric, a mesh, or the like formed by using a wet or dry process is processed. Preferably, a metal fiber structure in which metal fibers are accumulated and then bonded together is used as each of the first metal fiber structure 40 and the second metal fiber structure 42. The metal fibers being bonded together means that the metal fibers are physically fixed to each other to form bonded portions. In each of the first metal fiber structure 40 and the second metal fiber structure 42, the metal fibers may be directly fixed to each other at bonded portions, or parts of the metal fibers may be indirectly fixed to each other via a component other than the metal component.

Since each of the first metal fiber structure 40 and the second metal fiber structure 42 is formed from metal fibers, voids exist inside the first metal fiber structure 40 and the second metal fiber structure 42. Accordingly, the fluid flowing through each flow passage 50 can pass through the inside of the first metal fiber structure 40 and the second metal fiber structure 42, in particular, the respective rod-shaped members 32 and 34. In addition, in the case where the metal fibers are bonded together in the first metal fiber structure 40 and the second metal fiber structure 42, voids are more easily formed between the metal fibers forming the first metal fiber structure 40 and the second metal fiber structure 42. Such voids may be formed, for example, by entangling the metal fibers. Since the first metal fiber structure 40 and the second metal fiber structure 42 have such voids, the fluid flowing through each flow passage 50 is introduced into the inside of the first metal fiber structure 40 and the second metal fiber structure 42, in particular, the respective rod-shaped members 32 and 34, so that the heat exchange performance for the fluid is easily enhanced. In addition, in each of the first metal fiber structure 40 and the second metal fiber structure 42, the metal fibers are preferably sintered at the bonded portions. When the metal fibers are sintered, the thermal conduction properties and the homogeneity of the first metal fiber structure 40 and the second metal fiber structure 42 are easily stabilized.

Each connection member 24 and each connection member 26 of the first metal fiber structure 40 and the second metal fiber structure 42 may be composed of a metal body instead of metal fibers. In this case, since each plate-shaped outer member 44 is also composed of the metal body 22, the fluid can be prevented from leaking from each flow passage 50 through the frame 20 at locations other than the outlet 20b to the outside.

As still another example, each outer member 44 may be formed from metal fibers instead of being composed of the metal body 22.

Moreover, the first metal fiber structure 40 and the second metal fiber structure 42 may be joined by a bonding agent, or may be joined by fusion bonding or sintering.

Next, the operation of the temperature regulation unit 10 according to the present embodiment will be described. As shown by arrows in FIG. 1, the fluid as the heat-transfer medium having entered the inside of the frame 20 from the inlet 20a flows through each flow passage 50, which is formed between the respective rod-shaped members 32 of the first metal fiber structure 40 and the respective rod-shaped members 34 of the second metal fiber structure 42, along the flow direction in the rightward direction in FIG. 1 and FIG. 2. At this time, since each flow passage 50 meanders along the flow direction, the fluid also flows through each flow passage 50 while meandering. In this case, the pressure loss of the fluid flowing through each flow passage 50 is moderately increased, and the staying time of the fluid in each flow passage 50 can be lengthened, so that the heat transfer effect can be enhanced. In addition, since each rod-shaped member 32 of the first metal fiber structure 40 and each rod-shaped member 34 of the second metal fiber structure 42 are formed from metal fibers, the surface area of each of the rod-shaped members 32 and 34 is increased, and the thermal conductivities of the first metal fiber structure 40 and the second metal fiber structure 42 can be increased. In the case where each of the rod-shaped members 32 and 34 is made of randomly arranged short metal fibers, it is easy to generate turbulent flow in the fluid flowing through each flow passage 50. In this case, the pressure loss of the fluid flowing through each flow passage 50 is further increased, and the staying time of the fluid in each flow passage 50 can be further lengthened, so that the heat transfer effect can be further enhanced.

The temperature regulation unit 10 according to the present embodiment configured as described above includes a plurality of stacked porous metal structures (specifically, the first metal fiber structure 40 and the second metal fiber structure 42) each of which has a plurality of rod-shaped members 32 or 34 extending parallel to each other so as to be spaced apart from each other and connection members 24 or 26 connecting the respective rod-shaped members 32 or 34 and is formed from metal, the respective rod-shaped members 32 and 34 of the respective porous metal structures extend parallel to each other, and a flow passage 50 for the fluid is formed in a gap between the respective rod-shaped members 32 and 34.

In this case, since the fluid flows through the flow passage 50 while avoiding the respective rod-shaped members 32 and 34, the pressure loss of the fluid flowing through the flow passage 50 is moderately increased, and the staying time of the fluid in the flow passage 50 can be lengthened, so that the heat transfer effect can be enhanced. In addition, in the case where the first metal fiber structure 40 and the second metal fiber structure 42 as the porous metal structures are formed from metal fibers, the surface area of each of the rod-shaped members 32 and 34 is increased, and the thermal conductivities of the first metal fiber structure 40 and the second metal fiber structure 42 can be increased. Therefore, the temperature regulation unit 10 has excellent heat exchange capability.

As for the pluralities of rod-shaped members 32 and 34 extending parallel to each other so as to be spaced apart from each other, the direction in which a certain rod-shaped member 32 or 34 extends may be slightly tilted relative to the direction in which another rod-shaped member 32 or 34 extends. Specifically, as for the pluralities of rod-shaped members 32 and 34, an angle between the direction in which a certain rod-shaped member 32 or 34 extends and the direction in which another rod-shaped member 32 or 34 extends may be in the range of −10° to 10°.

Moreover, a method for manufacturing a temperature regulation unit according to the present embodiment includes: a step of accumulating a plurality of metal fibers on a receiving part (specifically, a graphite plate); a step of sintering the plurality of metal fibers accumulated on the receiving part, to produce a plurality of porous metal structures (specifically, the first metal fiber structure 40 and the second metal fiber structure 42) each of which has a plurality of rod-shaped members 32 or 34 extending parallel to each other so as to be spaced apart from each other and connection members 24 or 26 connecting the respective rod-shaped members 32 or 34 and is formed from metal; and a step of stacking the plurality of porous metal structures such that the respective rod-shaped members 32 and 34 of the respective porous metal structures extend parallel to each other, to form a flow passage 50 for the fluid in a gap between the respective rod-shaped members 32 and 34. According to such a method for manufacturing a temperature regulation unit, it is possible to manufacture the temperature regulation unit 10 configured as described above.

Moreover, in the temperature regulation unit 10 according to the present embodiment, the flow passage 50 for the fluid is formed between the pluralities of rod-shaped members 32 and 34, of the porous metal structures, extending parallel to each other so as to be spaced apart from each other; in the flow passage 50, the fluid flows along the flow direction which is the direction orthogonal to the direction in which the rod-shaped members 32 and 34 extend; and the flow passage 50 meanders along the flow direction.

In this case, since the fluid flows while meandering along the flow passage 50, the pressure loss of the fluid flowing through the flow passage 50 is moderately increased as the heat exchange area for the fluid increases, and the staying time of the fluid in the flow passage 50 can be lengthened, so that the heat transfer effect can be enhanced. In addition, since each of the rod-shaped members 32 and 34 is a part of the porous metal structure, the surface area of each of the rod-shaped members 32 and 34 is increased, and the thermal conductivity of each of the rod-shaped members 32 and 34 can be increased. Therefore, the temperature regulation unit 10 has excellent heat exchange capability.

The temperature regulation unit according to the present embodiment is not limited to the above-described mode. Other various examples of the temperature regulation unit according to the present embodiment will be described below.

Figure 8:
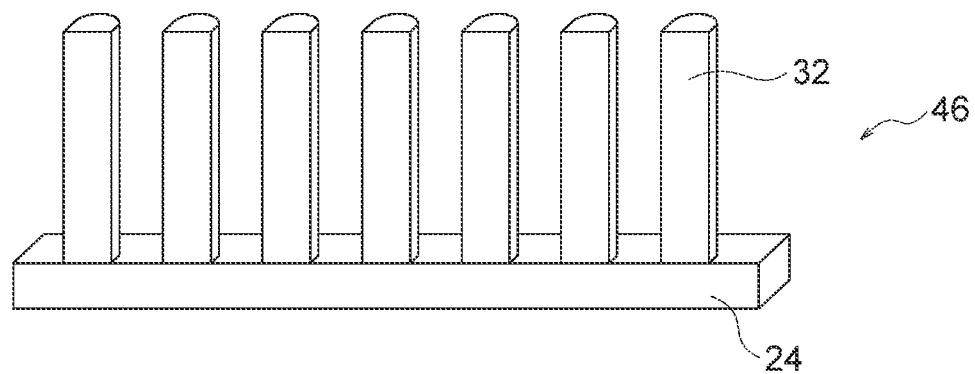
FIG. 8 is a perspective view showing the configuration of a first metal fiber structure included in a temperature regulation unit according to a modification.
Figure 9:
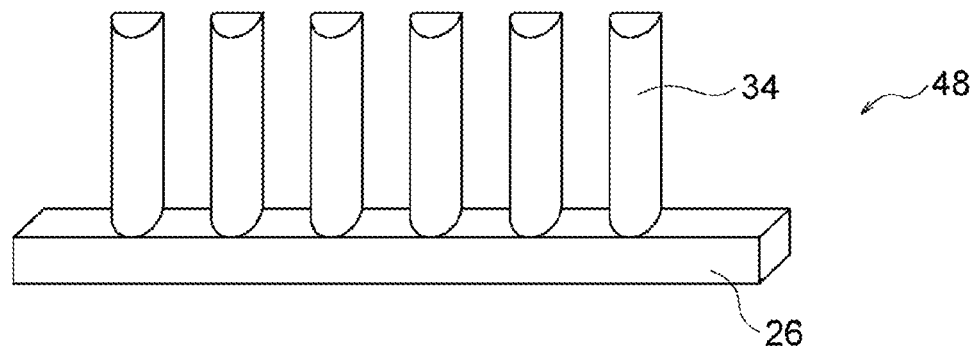
FIG. 9 is a perspective view showing the configuration of a second metal fiber structure included in the temperature regulation unit according to the modification.

A temperature regulation unit according to a modification includes a first metal fiber structure 46 shown in FIG. 8 and a second metal fiber structure 48 shown in FIG. 9 which are alternately stacked. Specifically, a metal fiber structure stacked body is formed by alternately stacking the first metal fiber structure 46 shown in FIG. 8 and the second metal fiber structure 48 shown in FIG. 9, and the plate-shaped outer member 44 shown in FIG. 7 is attached to each of both sides of the stacked body.

The first metal fiber structure 46 has a plurality of rod-shaped members 32 extending parallel to each other so as to be spaced apart from each other, and one connection member 24 connecting the respective rod-shaped members 32. The shape of each rod-shaped member 32 used in the first metal fiber structure 46 shown in FIG. 8 is substantially the same as the shape of each rod-shaped member 32 used in the metal fiber structure 40 shown in FIG. 5. In addition, the connection member 24 is attached to one end portion of each rod-shaped member 32. Accordingly, the first metal fiber structure 46 has a so-called comb shape.

The second metal fiber structure 48 has a plurality of rod-shaped members 34 extending parallel to each other so as to be spaced apart from each other, and one connection member 26 connecting the respective rod-shaped members 34. The shape of each rod-shaped member 34 used in the second metal fiber structure 48 shown in FIG. 9 is substantially the same as the shape of each rod-shaped member 34 used in the metal fiber structure 42 shown in FIG. 6. In addition, the connection member 26 is attached to one end portion of each rod-shaped member 34. Accordingly, the second metal fiber structure 48 has a so-called comb shape.

In the temperature regulation unit according to the modification, a frame is configured by combining the connection member 24 of the first metal fiber structure 46, the connection member 26 of the second metal fiber structure 48, and the plate-shaped outer members 44. Specifically, the plate-shaped outer member 44 shown in FIG. 7 is disposed on each of both sides of the stacked body formed by alternately stacking the first metal fiber structure 46 and the second metal fiber structure 48, and the plate-shaped outer member 44 formed of the metal body 22 is also attached to another end portion of each rod-shaped member 32 or 34 in the stacked body. Accordingly, a frame having an inlet and an outlet is formed.

In such a temperature regulation unit according to the modification as well, the fluid flows along each flow passage 50 extending parallel to the connection member 24 of the first metal fiber structure 46 and the connection member 26 of the second metal fiber structure 48.

As described above, the cross-sectional shape of each of each rod-shaped member 32 of the first metal fiber structure 46 and each rod-shaped member 34 of the second metal fiber structure 48 is a mountain shape, that is, a region surrounded by a straight line and a convex curve. Therefore, a tapered portion 32*p* or 34*p* is formed around the top of the convex curve of the cross-sectional shape. The respective tapered portions 32*p* and 34*p* are disposed at both side edges of each flow passage 50.

Moreover, the first metal fiber structure 46 and the second metal fiber structure 48 are alternately stacked such that the tapered portions 32*p* and 34*p* of the respective rod-shaped members 32 and 34 of metal fiber structures adjacent to each other face each other or face opposite sides. Accordingly, each flow passage 50 meanders along the direction in which the respective connection members 24 and 26 extend, that is, the flow direction of the fluid.

Moreover, among the pluralities of rod-shaped members 32 and 34 that define the respective side edges of each flow passage 50, two rod-shaped members adjacent to each other are in contact with each other. That is, each rod-shaped member 32 of the first metal fiber structure 46 and each rod-shaped member 34 of the second metal fiber structure 48 adjacent to the first metal fiber structure 46 are in contact with each other. Accordingly, each of the plurality of flow passages 50 extending parallel to each other along the flow direction is demarcated by the rod-shaped members 32 and 34. Therefore, each of the plurality of flow passages 50 does not communicate with another flow passage 50.

Moreover, each of the first metal fiber structure 46 and the second metal fiber structure 48 is formed from metal fibers. As the metal fibers forming the first metal fiber structure 46 and the second metal fiber structure 48, metal fibers that are substantially the same as the metal fibers forming the first metal fiber structure 40 and the second metal fiber structure 42 described above are used.

Also, in the temperature regulation unit including the first metal fiber structure 46 shown in FIG. 8 and the second metal fiber structure 48 shown in FIG. 9 which are alternately stacked as described above, similar to the temperature regulation unit 10 shown in FIG. 1, etc., the pressure loss of the fluid flowing through the flow passage 50 is moderately increased, and the staying time of the fluid in the flow passage 50 can be lengthened, so that the heat transfer effect can be enhanced. In addition, since each of the rod-shaped members 32 and 34 is formed from metal fibers, the surface area of each of the rod-shaped members 32 and 34 is increased, and the thermal conductivity of each of the rod-shaped members 32 and 34 can be increased. Therefore, the temperature regulation unit 10 has excellent heat exchange capability.

Figure 10:
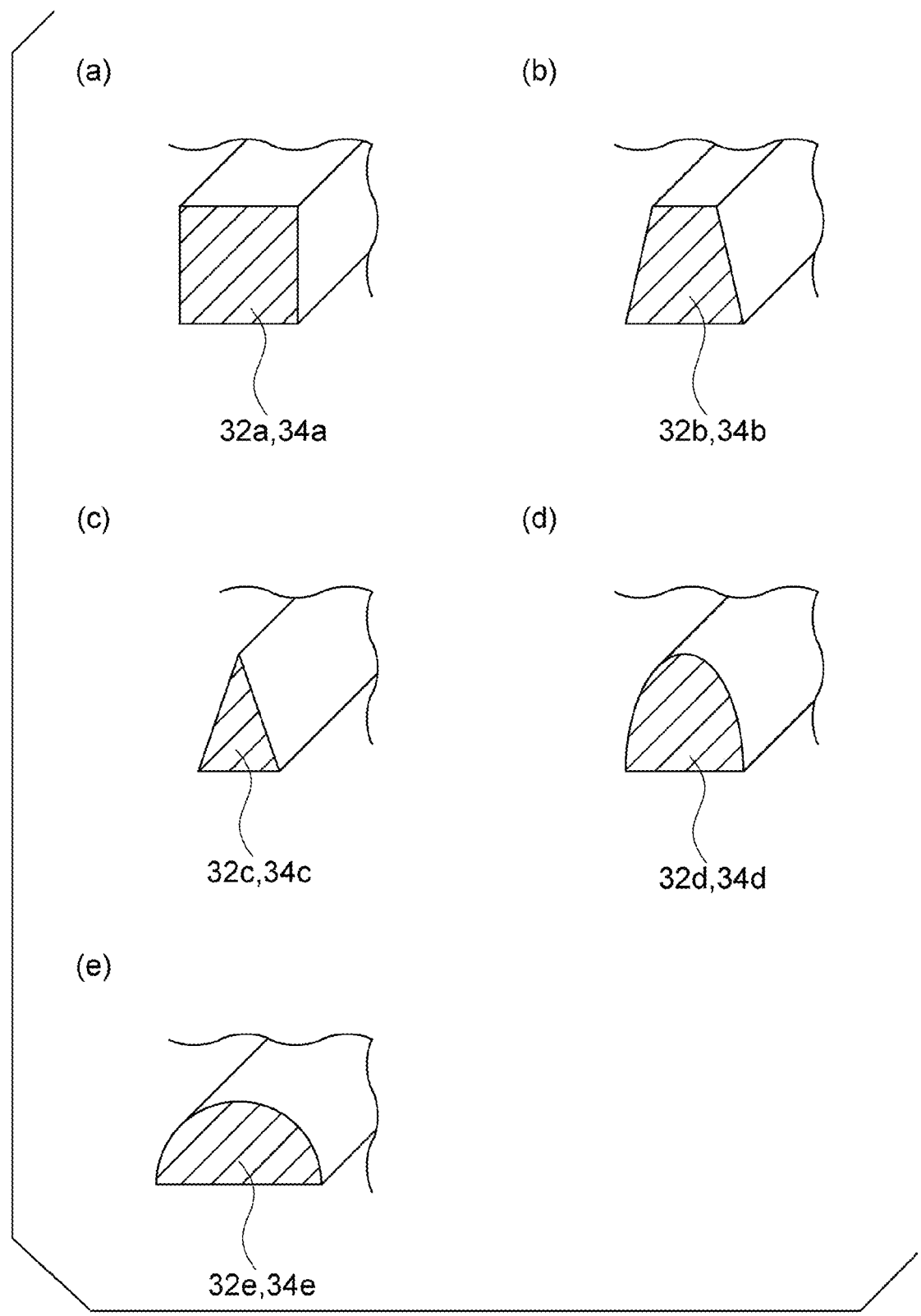
FIGS. 10(a) to (e) are cross-sectional views of rod-shaped members included in temperature regulation units according to various embodiments of the present invention.

Moreover, in a temperature regulation unit according to another modification, various shapes can be used for a cross-section of each rod-shaped member. Specifically, instead of the respective rod-shaped members 32 and 34 shown in FIG. 1 to FIG. 6, any of rod-shaped members 32*a* and 34*a* each having a cross-sectional shape that is a quadrilateral shape (specifically, a square shape or a rectangular shape) as shown in FIG. 10(*a*), rod-shaped members 32*b* and 34*b* each having a cross-sectional shape that is a trapezoidal shape as shown in FIG. 10(*b*), rod-shaped members 32*c* and 34*c* each having a cross-sectional shape that is a triangular shape (specifically, an isosceles triangular shape) as shown in FIG. 10(*c*), rod-shaped members 32*d* and 34*d* each having a cross-sectional shape that is a mountain shape, that is, a region surrounded by a straight line and a convex curve, as shown in FIG. 10(*d*), and rod-shaped members 32*e* and 34*e* each having a cross-sectional shape that is a mountain shape, that is, a region surrounded by a straight line and a convex curve, as shown in FIG. 10(*e*), may be used. In the cross-sectional shape of each of the rod-shaped members 32*e* and 34*e* shown in FIG. 10(*e*), the curvature of the convex curve is smaller than that in the cross-sectional shape of each of the rod-shaped members 32*d* and 34*d* shown in FIG. 10(*d*). In addition, as still another type of rod-shaped members, rod-shaped members each having a cross-sectional shape that is a semicircular shape may be used.

Among the cross-sections of the various rod-shaped members shown in FIG. 10, the cross-sectional shape of each of the rod-shaped members 32*b* and 34*b* shown in FIG. 10(*b*), the rod-shaped members 32*c* and 34*c* shown in FIG. 10(*c*), the rod-shaped members 32*d* and 34*d* shown in FIG. 10(*d*), and the rod-shaped members 32*e* and 34*e* shown in FIG. 10(*e*) includes a tapered portion. In this case, as compared to the case where the rod-shaped members 32*a* and 34*a* shown in FIG. 10(*a*) are used, the time for which the fluid flows through the temperature regulation unit can be inhibited from becoming excessively long, such excessive length reducing the fluid processing efficiency (flow rate).

Moreover, among the cross-sections of the various rod-shaped members shown in FIG. 10, the rod-shaped members 32*d* and 34*d* shown in FIG. 10(*d*) and the rod-shaped members 32*e* and 34*e* shown in FIG. 10(*e*) include curved surfaces. In this case, as compared to the case where the rod-shaped members 32*a* and 34*a* shown in FIG. 10(*a*), the rod-shaped members 32*b* and 34*b* shown in FIG. 10(*b*), or the rod-shaped members 32*c* and 34*c* shown in FIG. 10(*c*) are used, the time for which the fluid flows through the temperature regulation unit can be inhibited from becoming excessively long, such excessive length reducing the fluid processing efficiency (flow rate).

Moreover, in the cross-sectional shape of each of the rod-shaped members 32*e* and 34*e* shown in FIG. 10(*e*), the curvature of the convex curve is smaller than that in the cross-sectional shape of each of the rod-shaped members 32*d* and 34*d* shown in FIG. 10(*d*), and in this case, the time for which the fluid flows through the temperature regulation unit can be inhibited from becoming excessively long, such excessive length reducing the fluid processing efficiency (flow rate).

Figure 11:
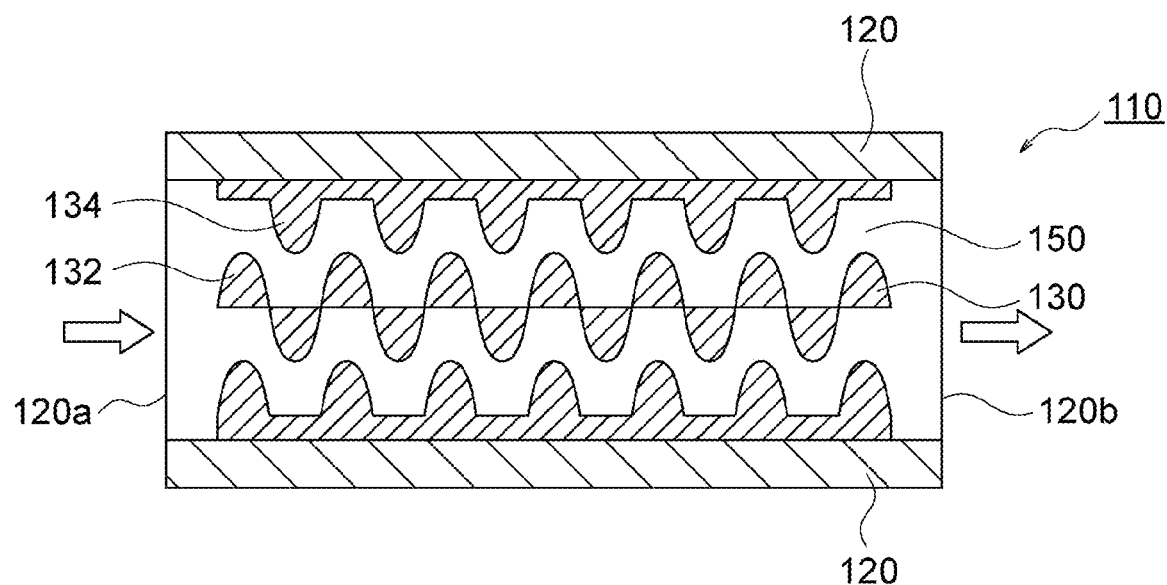
FIG. 11 is a cross-sectional view showing the internal configuration of a temperature regulation unit according to another modification.
Figure 12:
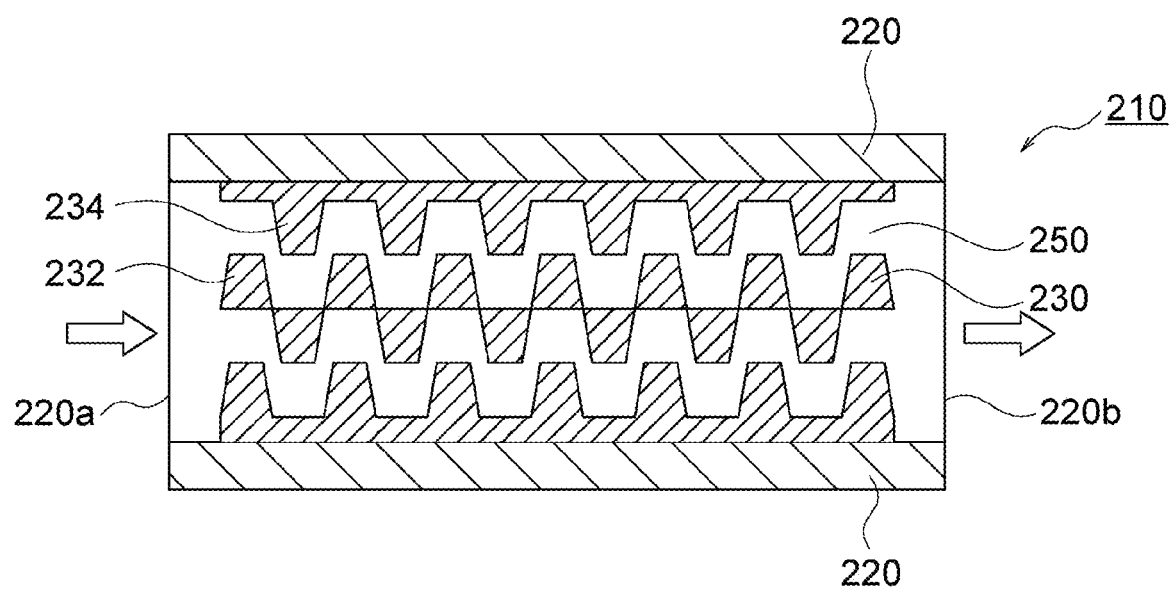
FIG. 12 is a cross-sectional view showing the internal configuration of a temperature regulation unit according to still another modification.
Figure 13:
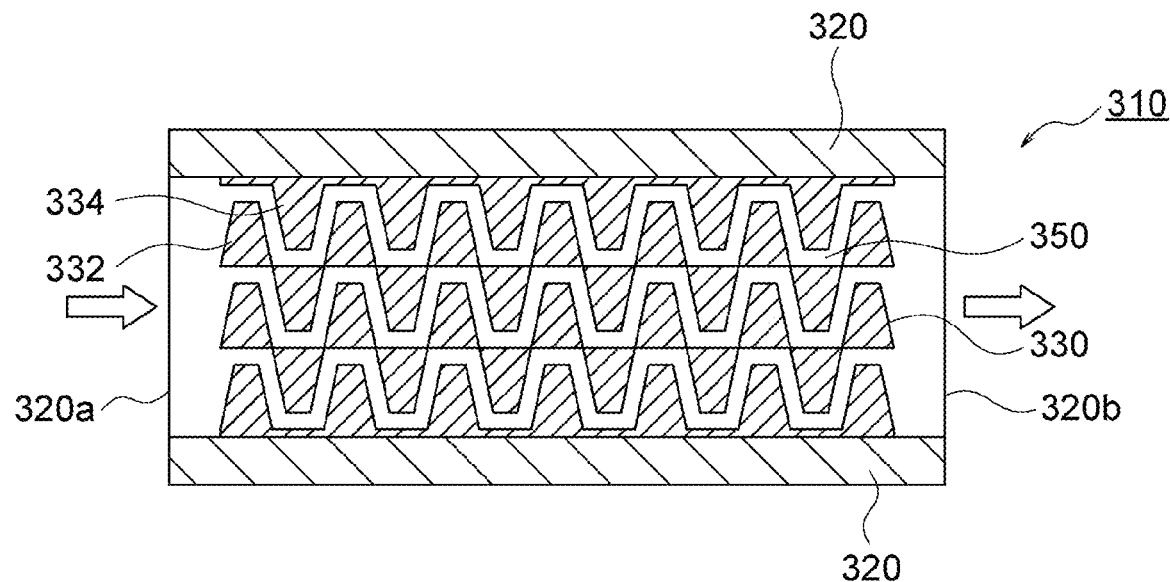
FIG. 13 is a cross-sectional view showing the internal configuration of a temperature regulation unit according to still another modification.
Figure 14:
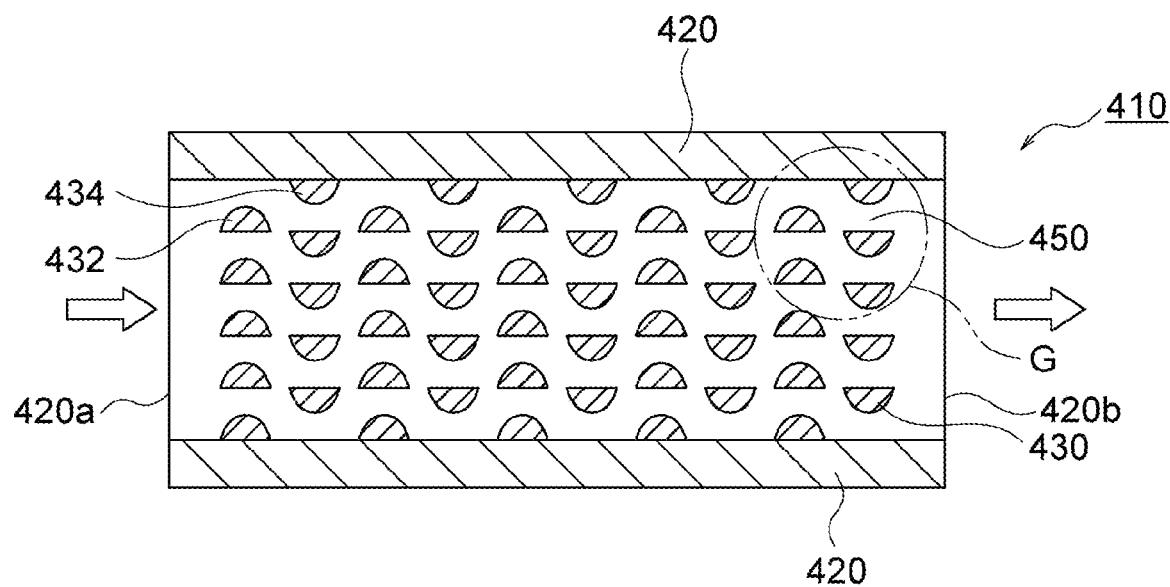
FIG. 14 is a cross-sectional view showing the internal configuration of a temperature regulation unit according to still another modification.
Figure 15:
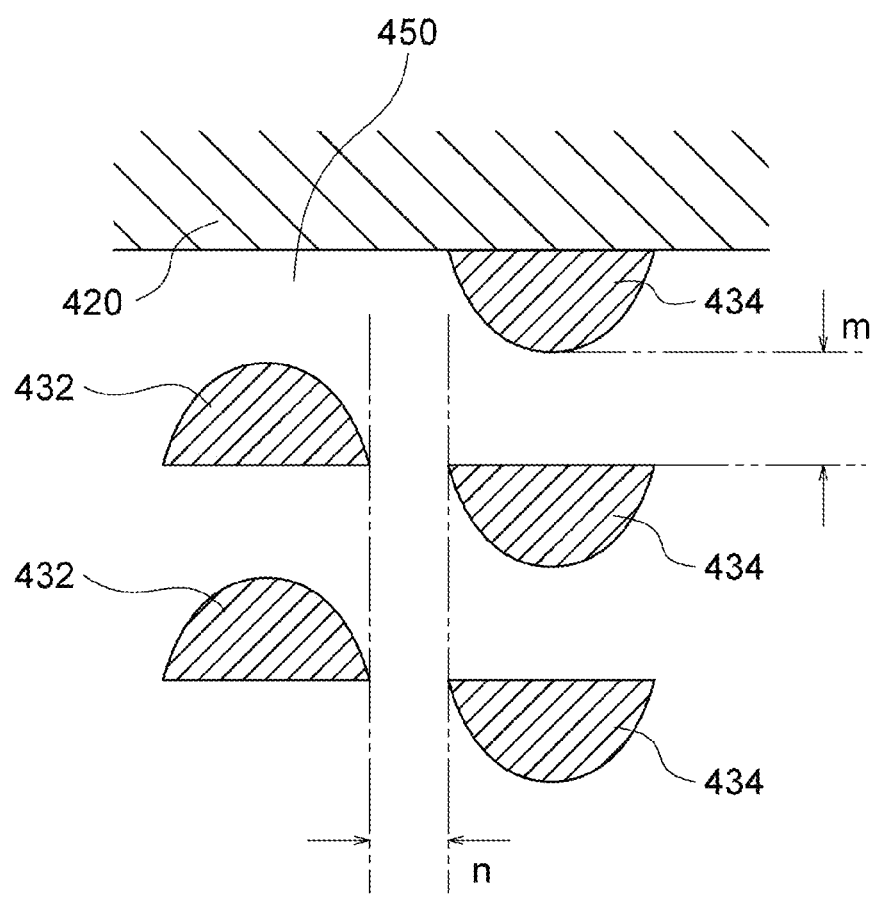
FIG. 15 is a cross-sectional view showing a range G in the internal configuration of the temperature regulation unit shown in FIG. 14, in an enlarged manner.

Moreover, as a temperature regulation unit according to still another modification, a temperature regulation unit 110 shown in FIG. 11, a temperature regulation unit 210 shown in FIG. 12, a temperature regulation unit 310 shown in FIG. 13, or a temperature regulation unit 410 shown in FIG. 14 and FIG. 15 may be used.

The temperature regulation unit 110 shown in FIG. 11 includes a substantially rectangular parallelepiped-shaped frame 120 having an inlet 120*a* and an outlet 120*b*, and a plurality of rod-shaped members 130 provided inside the frame 120, and a plurality of flow passages 150 for the fluid are formed in gaps between the respective rod-shaped members 130. The fluid enters the inside of the frame 120 from the inlet 120*a* of the frame 120, flows through each flow passage 150 in the rightward direction in FIG. 11, and flows out of the frame 120 from the outlet 120b.

The plurality of rod-shaped members 130 include a plurality of rod-shaped members 132 of a first metal fiber structure (not shown) and a plurality of rod-shaped members 134 of a second metal fiber structure (not shown). A cross-sectional shape of each of the rod-shaped members 132 and 134 is a mountain shape, that is, a region surrounded by a straight line and a convex curve. In addition, the curvature of the convex curve of the cross-sectional shape of each of the rod-shaped members 132 and 134 is larger than the curvature of the convex curve of the cross-sectional shape of each of the rod-shaped members 32 and 34 shown in FIG. 1 to FIG. 6. Moreover, the rod-shaped members 132 and 134 are disposed such that the directions of the convex curves thereof are opposite to each other. Moreover, the first metal fiber structure has a connection member (not shown) connecting the plurality of rod-shaped members 132. Moreover, the second metal fiber structure has a connection member (not shown) connecting the plurality of rod-shaped members 134.

The temperature regulation unit 110 shown in FIG. 11 includes a plurality of such first metal fiber structures and second metal fiber structures which are alternately stacked. In this case, the respective rod-shaped members 132 and 134 of the respective metal fiber structures extend parallel to each other, and the respective flow passages 150 for the fluid are formed in the gaps between the respective rod-shaped members 132 and 134.

In other words, the respective flow passages 150 for the fluid are formed between the plurality of rod-shaped members 130 which extend parallel to each other so as to be spaced apart from each other and are formed from metal fibers, the fluid flows in each flow passage 150 along a flow direction which is a direction orthogonal to the direction in which the rod-shaped members 130 extend, and each flow passage 150 meanders along the flow direction.

In such a temperature regulation unit 110 as well, similar to the temperature regulation unit 10 shown in FIG. 1, etc., the pressure loss of the fluid flowing through the flow passage 150 is moderately increased, and the staying time of the fluid in the flow passage 150 can be lengthened, so that the heat transfer effect can be enhanced. In addition, since each rod-shaped member 130 is formed from metal fibers, the surface area of each rod-shaped member 130 is increased, and the thermal conductivity of each rod-shaped member 130 can be increased. Therefore, the temperature regulation unit 110 has excellent heat exchange capability.

The temperature regulation unit 210 shown in FIG. 12 includes a substantially rectangular parallelepiped-shaped frame 220 having an inlet 220a and an outlet 220b, and a plurality of rod-shaped members 230 provided inside the frame 220, and a plurality of flow passages 250 for the fluid are formed in gaps between the respective rod-shaped members 230. The fluid enters the inside of the frame 220 from the inlet 220a of the frame 220, flows through each flow passage 250 in the rightward direction in FIG. 12, and flows out of the frame 220 from the outlet 220b.

The plurality of rod-shaped members 230 include a plurality of rod-shaped members 232 of a first metal fiber structure (not shown) and a plurality of rod-shaped members 234 of a second metal fiber structure (not shown). A cross-sectional shape of each of the rod-shaped members 232 and 234 is a trapezoidal shape. In addition, the rod-shaped members 232 and 234 are disposed such that the directions of the trapezoidal shapes thereof are opposite to each other. Moreover, the first metal fiber structure has a connection member (not shown) connecting the plurality of rod-shaped members 232. Moreover, the second metal fiber structure has a connection member (not shown) connecting the plurality of rod-shaped members 234.

The temperature regulation unit 210 shown in FIG. 12 includes a plurality of such first metal fiber structures and second metal fiber structures which are alternately stacked. In this case, the respective rod-shaped members 232 and 234 of the respective metal fiber structures extend parallel to each other, and the respective flow passages 250 for the fluid are formed in the gaps between the respective rod-shaped members 232 and 234.

In other words, the respective flow passages 250 for the fluid are formed between the plurality of rod-shaped members 230 which extend parallel to each other so as to be spaced apart from each other and are formed from metal fibers, the fluid flows in each flow passage 250 along a flow direction which is a direction orthogonal to the direction in which the rod-shaped members 230 extend, and each flow passage 250 meanders along the flow direction.

In such a temperature regulation unit 210 as well, similar to the temperature regulation unit 10 shown in FIG. 1, etc., the pressure loss of the fluid flowing through the flow passage 250 is increased, and the staying time of the fluid in the flow passage 250 can be lengthened, so that the heat transfer effect can be enhanced. In addition, since each rod-shaped member 230 is formed from metal fibers, the surface area of each rod-shaped member 230 is increased, and the thermal conductivity of each rod-shaped member 230 can be increased. Therefore, the temperature regulation unit 210 has excellent heat exchange capability.

The temperature regulation unit 310 shown in FIG. 13 includes a substantially rectangular parallelepiped-shaped frame 320 having an inlet 320a and an outlet 320b, and a plurality of rod-shaped members 330 provided inside the frame 320, and a plurality of flow passages 350 for the fluid are formed in gaps between the respective rod-shaped members 330. The fluid enters the inside of the frame 320 from the inlet 320a of the frame 320, flows through each flow passage 350 in the rightward direction in FIG. 13, and flows out of the frame 320 from the outlet 320b.

The plurality of rod-shaped members 330 include a plurality of rod-shaped members 332 of a first metal fiber structure (not shown) and a plurality of rod-shaped members 334 of a second metal fiber structure (not shown). A cross-sectional shape of each of the rod-shaped members 332 and 334 is a trapezoidal shape. In addition, the rod-shaped members 332 and 334 are disposed such that the directions of the trapezoidal shapes thereof are opposite to each other. Moreover, the first metal fiber structure has a connection member (not shown) connecting the plurality of rod-shaped members 332. Moreover, the second metal fiber structure has a connection member (not shown) connecting the plurality of rod-shaped members 334.

Moreover, the trapezoidal shape of the cross-section of each of the rod-shaped members 332 and 334 shown in FIG. 13 has an aspect ratio (specifically, a value obtained by dividing the height of the trapezoid by the length of the base of the trapezoid) larger than that of each of the rod-shaped members 232 and 234 shown in FIG. 12, and the distance between the respective rod-shaped members 332 and 334 (that is, the width of each flow passage 350) is smaller than the distance between the respective rod-shaped members 232 and 234 (the width of each flow passage 250). Accordingly, the pressure loss of the fluid flowing through each flow passage 350 becomes larger, and the staying time of the fluid in each flow passage 350 becomes longer, so that the heat transfer effect can be enhanced more than that of the temperature regulation unit 210 shown in FIG. 12.

The temperature regulation unit 310 shown in FIG. 13 includes a plurality of such first metal fiber structures and second metal fiber structures which are alternately stacked. In this case, the respective rod-shaped members 332 and 334 of the respective metal fiber structures extend parallel to each other, and the respective flow passages 350 for the fluid are formed in the gaps between the respective rod-shaped members 332 and 334.

In other words, the respective flow passages 350 for the fluid are formed between the plurality of rod-shaped members 330 which extend parallel to each other so as to be spaced apart from each other and are formed from metal fibers, the fluid flows in each flow passage 350 along a flow direction which is a direction orthogonal to the direction in which the rod-shaped members 330 extend, and each flow passage 350 meanders along the flow direction. In addition, in the temperature regulation unit 310 shown in FIG. 13, in each flow passage 350, the rod-shaped members 332 and 334 partially overlap each other when seen along the direction in which the connection members extend (that is, the right-left direction in FIG. 13), and each flow passage 350 has a shape in which a virtual straight line extending parallel to the connection members (that is, a virtual straight line extending in the right-left direction in FIG. 13) always hits the rod-shaped members 332 and 334.

In such a temperature regulation unit 310 as well, similar to the temperature regulation unit 10 shown in FIG. 1, etc., the pressure loss of the fluid flowing through the flow passage 350 is increased, and the staying time of the fluid in the flow passage 350 can be lengthened, so that the heat transfer effect can be enhanced. In addition, since, in each flow passage 350, the rod-shaped members 332 and 334 partially overlap each other when seen along the direction in which the connection members extend (that is, the right-left direction in FIG. 13), the staying time of the fluid in each flow passage 350 becomes longer, and therefore, the heat transfer effect can be further enhanced. Moreover, since each rod-shaped member 330 is formed from metal fibers, the surface area of each rod-shaped member 330 is increased, and the thermal conductivity of each rod-shaped member 330 can be increased. Therefore, the temperature regulation unit 310 has excellent heat exchange capability.

The temperature regulation unit 410 shown in FIG. 14 includes a substantially rectangular parallelepiped-shaped frame 420 having an inlet 420a and an outlet 420b, and a plurality of rod-shaped members 430 provided inside the frame 420, and a plurality of flow passages 450 for the fluid are formed in gaps between the respective rod-shaped members 430. The fluid enters the inside of the frame 420 from the inlet 420a of the frame 420, flows through each flow passage 450 in the rightward direction in FIG. 14, and flows out of the frame 420 from the outlet 420b.

The plurality of rod-shaped members 430 include a plurality of rod-shaped members 432 of a first metal fiber structure (not shown) and a plurality of rod-shaped members 434 of a second metal fiber structure (not shown). A cross-sectional shape of each of the rod-shaped members 432 and 434 is a region surrounded by a straight line and a convex curve. In addition, the curvature of the convex curve of the cross-sectional shape of each of the rod-shaped members 432 and 434 is substantially equal to the curvature of the convex curve of the cross-sectional shape of each of the rod-shaped members 32 and 34 shown in FIG. 1 to FIG. 6. Moreover, the rod-shaped members 432 and 434 are disposed such that the directions of the convex curves thereof are opposite to each other. Moreover, the first metal fiber structure has a connection member (not shown) connecting the plurality of rod-shaped members 432. Moreover, the second metal fiber structure has a connection member (not shown) connecting the plurality of rod-shaped members 434.

The temperature regulation unit 410 shown in FIG. 14 includes a plurality of such first metal fiber structures and second metal fiber structures which are alternately stacked. In this case, the respective rod-shaped members 432 and 434 of the respective metal fiber structures extend parallel to each other, and the respective flow passages 450 for the fluid are formed in the gaps between the respective rod-shaped members 432 and 434.

Moreover, in the temperature regulation unit 410 shown in FIG. 14, among the pluralities of rod-shaped members 432 and 434 that define the respective side edges of each flow passage 450, two rod-shaped members 432 and 434 adjacent to each other are separated from each other. That is, two rod-shaped members 432 and 434 adjacent to each other in the flow direction of the fluid flowing through each flow passage 450 are not in contact with each other.

FIG. 15 is a cross-sectional view showing a range G in the internal configuration of the temperature regulation unit 410 shown in FIG. 14, in an enlarged manner. As shown in FIG. 15, a distance m of a gap between two rod-shaped members 432 and 434 adjacent to each other in a width direction (that is, the up-down direction in FIG. 15) which is a direction orthogonal to the flow direction of the fluid flowing in each flow passage 450 is larger than a distance n of a gap between two rod-shaped members 432 and 434 adjacent to each other in the flow direction of the fluid flowing in each flow passage 450 (that is, the right-left direction in FIG. 15). In this case, even though two rod-shaped members 432 and 434 adjacent to each other in the flow direction of the fluid flowing through each flow passage 450 are not in contact with each other, the distance n between the two rod-shaped member 432 and 434 adjacent to each other does not become large, so that the fluid flowing through a certain flow passage 450 and the fluid flowing through another flow passage 450 adjacent to this flow passage 450 can be inhibited from significantly interfering with each other and causing a significant disruption of the flow.

In such a temperature regulation unit 410 shown in FIG. 14 as well, similar to the temperature regulation unit 10 shown in FIG. 1, etc., the pressure loss of the fluid flowing through the flow passage 450 is moderately increased, and the staying time of the fluid in the flow passage 450 can be lengthened, so that the heat transfer effect can be enhanced. In addition, since each rod-shaped member 430 is formed from metal fibers, the surface area of each rod-shaped member 430 is increased, and the thermal conductivity of each rod-shaped member 430 can be increased. Therefore, the temperature regulation unit 410 has excellent heat exchange capability.

Each temperature regulation unit described above includes a plurality of stacked metal fiber structures formed from metal fibers. However, the temperature regulation unit according to the present invention is not limited to such a mode. As the temperature regulation unit according to the present invention, a temperature regulation unit including a plurality of stacked porous metal structures formed from metal may be used. In this case, as each porous metal structure, in addition to a metal fiber structure formed from metal fibers, a metal powder structure formed from metal powder, or a metal mixture formed from a mixture of metal fibers and metal powder may be used. Specifically, the metal powder structure is formed from metal powder by a powder metallurgy method such as a compaction-sintering method or a metal powder injection molding method. The metal mixture formed from a mixture of metal fibers and metal powder is obtained by mixing a particulate metal into the above-described metal fiber structure.

Even in such a case, when each porous metal structure is formed from porous metal, the surface area of each rod-shaped member is increased, and the thermal conductivity of the porous metal structure can be increased. Therefore, the temperature regulation unit has excellent heat exchange capability.

Moreover, in this case, in the method for manufacturing a temperature regulation unit, a plurality of metal fibers, metal particles, or mixtures of metal fibers and metal particles are accumulated on a receiving part, and then the plurality of metal fibers, metal particles, or mixtures accumulated on the receiving part are sintered, whereby a plurality of porous metal structures each of which has a plurality of rod-shaped members extending parallel to each other so as to be spaced apart from each other and a connection member connecting the respective rod-shaped members and is formed from metal can be produced. Then, the plurality of porous metal structures are stacked such that the respective rod-shaped members of the respective porous metal structures extend parallel to each other, whereby a flow passage for the fluid is formed in a gap between the respective rod-shaped members.

EXAMPLES

Hereinafter, the present invention will be described in more detail by means of examples and comparative examples.

First Example 1 kg of short copper fibers having an average fiber length of 0.114 mm and an average fiber diameter of 0.021 mm was put into a cutter mill (manufactured by Horai Co., Ltd.: BO-360 model), and the short copper fibers were processed using a 0.5 mm screen. Next, the short copper fibers taken out of the cutter mill were accumulated on a high-purity alumina plate (manufactured by KYOCERA Corporation). More specifically, a molding frame having a plurality of through holes (5 mm in length, 5 mm in width, 500 μm in height) formed therein was placed on the high-purity alumina plate in advance, and the short copper fibers were put into the through holes of the molding frame. Accordingly, the short copper fibers were accumulated inside the through holes of the molding frame on the high-purity alumina plate. Then, the high-purity alumina plate having the short copper fibers accumulated inside the through holes of the molding frame thereon was put into a vacuum sintering furnace (manufactured by CHUGAI RO CO., LTD.), and sintered in this vacuum sintering furnace under nitrogen gas at a pressure of 10 Torr and a sintering temperature of 1000° C. for 2 hours. Then, the sintered bodies were taken out of the molding frame, a spacer was placed to achieve a desired thickness, and the sintered bodies were pressed at a pressure of 100 kN. Through this process, metal fiber structures having a ladder shape were produced. Then, the produced metal fiber structures were stacked, thereby producing a temperature regulation unit having the shape shown in FIG. 2 to FIG. 4. In the temperature regulation unit according to the first example, a cross-section of each rod-shaped member has a semicircular shape.

Second Example

Metal fiber structures were produced in the same manner as the first example, and the produced metal fiber structures were stacked, thereby producing a temperature regulation unit having the shape shown in FIG. 13. In the temperature regulation unit according to the second example, a cross-section of each rod-shaped member has a semicircular shape.

First Comparative Example

Metal fiber structures were produced in the same manner as the first example, and the produced metal fiber structures were stacked, thereby producing a temperature regulation unit. Here, in the temperature regulation unit according to the first comparative example, each flow passage formed between the respective rod-shaped members does not meander along the flow direction (that is, the direction in which the connection members extend). More specifically, in the temperature regulation unit according to the first comparative example, a cross-section of each rod-shaped member has a semicircular shape, but when the metal fiber structures are stacked, flat portions of the respective rod-shaped members of metal fiber structures adjacent to each other are in contact with each other. Therefore, in the entire temperature regulation unit, the rod-shaped members having a circular column shape are arranged so as to be located at intersections of a lattice. In this case, in each flow passage, a fluid flows straight along the flow direction.

Second Comparative Example

Metal fiber structures were produced in the same manner as the first example, and the produced metal fiber structures were stacked, thereby producing a temperature regulation unit. Here, in the temperature regulation unit according to the second comparative example, no rod-shaped member exists inside a frame, and instead, flow passages are demarcated by plate-shaped partitions each extending along the flow direction (that is, the direction in which the connection members extend) and having a flat surface. That is, in each flow passage, a fluid flows straight along the flow direction.

Third Comparative Example

Metal fiber structures were produced in the same manner as the first example, and the produced metal fiber structures were stacked, thereby producing a temperature regulation unit. Here, in the temperature regulation unit according to the third comparative example, no rod-shaped member exists inside a frame. That is, in a flow passage, a fluid flows straight along the flow direction.

<Evaluation>

A heat transfer rate was calculated for the temperature regulation units according to the first and second examples and the temperature regulation units according to the first to third comparative examples. The examination results are shown in Table 1 below.

TABLE 1

|  | First example | Second example | First comparative example | Second comparative example | Third comparative example |
|---|---|---|---|---|---|
| Heat transfer rate (W/m² × K) | 296 | 268 | 199 | 96 | 58 |

Figure 16:
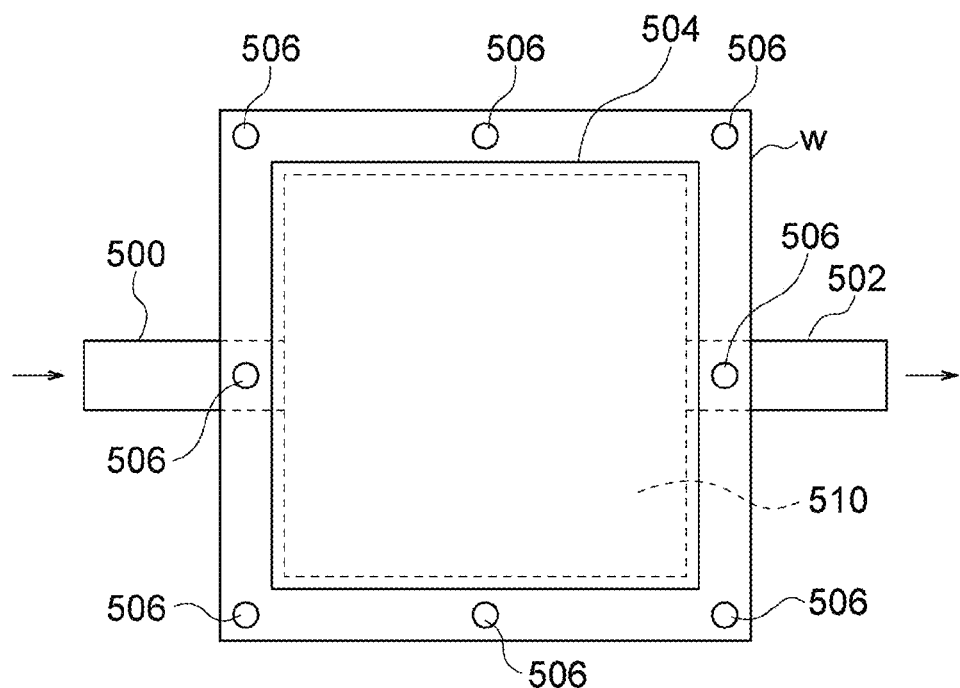
FIG. 16 is a top view of an evaluation device.
Figure 17:
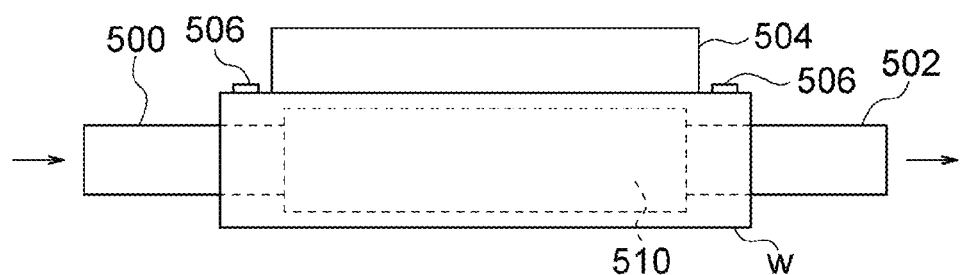
FIG. 17 is a front view of the evaluation device shown in FIG. 16.
Figure 18:
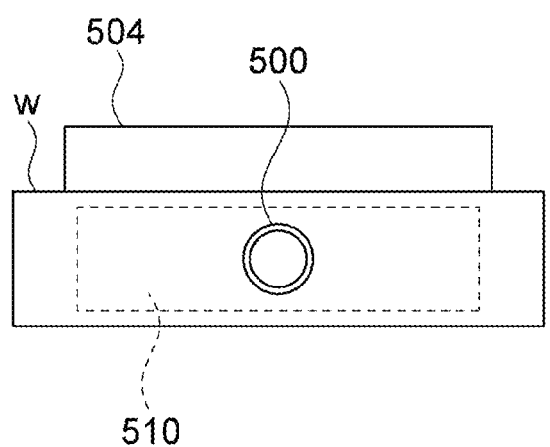
FIG. 18 is a left side view of the evaluation device shown in FIG. 16.

The heat transfer rate in Table 1 was measured under the condition of a flow rate of 100 L/min and a heat input of 100 W with air as fluid using an evaluation device shown in FIG. 16 to FIG. 18. FIG. 16 is a top view of the evaluation device, FIG. 17 is a front view of the evaluation device shown in FIG. 16, and FIG. 18 is a left side view of the evaluation device shown in FIG. 16.

Specifically, a fluid introduction port 500, a fluid discharge port 502, and a heater 504 were provided to each of the temperature regulation units according to the first and second examples and the temperature regulation units according to the first to third comparative examples (shown by reference character W in FIG. 16 to FIG. 18), and a fluid flowing through the temperature regulation unit was heated by the heater 504. The fluid that had entered the inside of the temperature regulation unit from the fluid introduction port 500 flowed through a fluid passage portion 510, and was discharged from the fluid discharge port 502 to the outside of the temperature regulation unit. In addition, the temperatures of the fluid in the fluid introduction port 500 and the fluid discharge port 502 were measured, and were used as an inlet temperature and an outlet temperature of the fluid, respectively. Moreover, eight thermometers 506 were installed on the surface of the temperature regulation unit near the heater 504 as shown in FIG. 16, and the average of the temperatures of the surface of the temperature regulation unit measured by these eight thermometers was used as Ts.

<Method for Measuring Heat Transfer Rate>

A heat input W from the heater 504 to the fluid, a transfer area S (heat transfer area) of the fluid passage portion 510 adjacent to the heater 504, the surface temperature Ts of a housing of the temperature regulation unit near the heater 504, an average temperature Tw of the passing fluid (the average of the inlet temperature and the outlet temperature of the fluid) were measured, and a heat transfer rate h was obtained from an equation, heat input W=heat transfer rate h×transfer area S×(surface temperature Ts–fluid average temperature Tw).

The temperature regulation units according to the first and second examples had better heat transfer rates than the temperature regulation units according to the first to third comparative examples. In each of the temperature regulation units according to the first to third comparative examples, since the fluid flows straight along the flow direction in the flow passage, the heat exchange area for transferring heat to the fluid flowing through the flow passage becomes small, and the heat transfer rate becomes relatively small. On the other hand, in each of the temperature regulation units according to the first and second examples, since each flow passage meanders along the flow direction, the pressure loss of the fluid flowing through each flow passage is moderately increased, and the staying time of the fluid in each flow passage can be lengthened, so that the heat transfer effect can be enhanced.

The invention claimed is:

1. A temperature regulation unit comprising a plurality of first and second structures of porous metal which are alternately stacked on each other wherein
    each first structure of porous metal has a plurality of rod-shaped members extending parallel to each other so as to be spaced apart from each other, each rod-shaped member having a length, and a connection member connecting the respective rod-shaped members,
    each second structure of porous metal has a plurality of rod-shaped members extending parallel to each other so as to be spaced apart from each other, each rod-shaped member having a length, and a connection member connecting the rod-shaped members,
    each rod-shaped member of the first structure of porous metal and each rod-shaped member of the second structure of porous metal adjacent to the first structure of porous metal are in contact with each other along each of their respective lengths,
    the rod-shaped members of the first structure of porous metal and the rod-shaped members of the second structure of porous metal extend parallel to each other, and
    the temperature regulation unit further comprises a plurality of flow passages for a fluid each of which is formed in a gap between the respective rod-shaped members and does not communicate with another flow passage.

2. The temperature regulation unit according to claim 1, wherein the fluid flows in the plurality of flow passages along a direction in which the connection members extend.

3. The temperature regulation unit according to claim 2, wherein a cross-sectional shape of each of the rod-shaped members includes a tapered portion, and the tapered portions are disposed at both side edges of a flow passage of the plurality of flow passages.

4. The temperature regulation unit according to claim 3, wherein the plurality of first and second structures of porous metal are stacked such that the tapered portions of each of the respective rod-shaped members of the first and second structures of porous metal adjacent to each other face each other or face opposite sides.

5. The temperature regulation unit according to claim 4, wherein each flow passage meanders along the direction in which the connection members extend.

6. The temperature regulation unit according to claim 1, wherein a cross-sectional shape of each of the rod-shaped members includes a tapered portion, and the tapered portions are disposed at both side edges of a flow passage of the plurality of flow passages.

7. The temperature regulation unit according to claim 6, wherein the plurality of first and second structures of porous metal are stacked such that the tapered portions of each of the respective rod-shaped members of the first and second structures of porous metal adjacent to each other face each other or face opposite sides.

8. The temperature regulation unit according to claim 7, wherein each flow passage meanders along the direction in which the connection members extend.

9. The temperature regulation unit according to claim 8, wherein
    in each flow passage, the respective rod-shaped members partially overlap each other when seen along the direction in which the connection members extend, and
    each of the flow passages has a shape in which a virtual straight line extending parallel to the connection members always hits the rod-shaped members.

10. The temperature regulation unit according to claim 7, wherein in each flow passage, the respective rod-shaped members partially overlap each other when seen along the direction in which the connection members extend, and each of the flow passages has a shape in which a virtual straight line extending parallel to the connection members always hits the rod-shaped members.

11. The temperature regulation unit according to claim 1, wherein the cross-sectional shape of each of the rod-shaped members is a trapezoidal shape, a triangular shape, a semicircular shape, or a mountain shape.

12. The temperature regulation unit according to claim 1, wherein each of the rod-shaped members includes a curved surface.

13. The temperature regulation unit according to claim 1, wherein each of the structures of porous metal has a comb shape or a ladder shape.

14. The temperature regulation unit according to claim 1, wherein each of the structures of porous metal is a metal fiber structure formed from metal fibers, a metal powder structure formed from metal powder, or a metal mixture formed from a mixture of metal fibers and metal powder.

15. A method for manufacturing a temperature regulation unit according to claim 1, the method comprising the steps of:

accumulating a plurality of metal fibers, metal particles, or mixtures of metal fibers and metal particles on a receiving part;

sintering the plurality of metal fibers, metal particles, or mixtures accumulated on the receiving part, to produce a plurality of structures of porous metal each of which has a plurality of rod-shaped members extending parallel to each other so as to be spaced apart from each other, each rod-shaped member having a length, and a connection member connecting the respective rod-shaped members; and stacking the plurality of structures of porous metal such that the temperature regulation unit includes a first structure of porous metal and a second structure of porous metal which are alternately stacked such that the rod-shaped members of the first structure of porous metal and the rod-shaped members of the second structure of porous metal extend parallel to each other, to form a plurality of flow passages for a fluid each of which is formed in a gap between the respective rod-shaped members and does not communicate with another flow passage, and each rod-shaped member of the first structure of porous metal and each rod-shaped member of the second structure of porous metal adjacent to the first structure of porous metal are in contact with each other along each of their respective lengths.

* * * * *